United States Patent
Yu et al.

(10) Patent No.: US 8,084,824 B2
(45) Date of Patent: Dec. 27, 2011

(54) METAL GATE TRANSISTOR AND METHOD FOR FABRICATING THE SAME

(75) Inventors: Chih-Hao Yu, Tainan County (TW);
Li-Wei Cheng, Hsin-Chu (TW);
Che-Hua Hsu, Hsin-Chu Hsien (TW);
Cheng-Hsien Chou, Tainan (TW);
Tian-Fu Chiang, Taipei (TW);
Chien-Ming Lai, Tainan County (TW);
Yi-Wen Chen, Tainan County (TW);
Jung-Tsung Tseng, Tainan (TW);
Chien-Ting Lin, Hsin-Chu (TW);
Guang-Hwa Ma, Hsinchu (TW)

(73) Assignee: United Microelectronics Corp.,
Science-Based Industrial Park, Hsin-Chu (TW)

( * ) Notice: Subject to any disclaimer, the term of this patent is extended or adjusted under 35 U.S.C. 154(b) by 241 days.

(21) Appl. No.: 12/208,352

(22) Filed: Sep. 11, 2008

(65) Prior Publication Data
US 2010/0059833 A1    Mar. 11, 2010

(51) Int. Cl.
*H01L 29/423* (2006.01)
(52) U.S. Cl. ........ 257/369; 257/315; 257/316; 257/288; 257/410; 257/E29.128; 257/E29.129; 257/E29.112
(58) Field of Classification Search .................. 257/288, 257/315, 316, 369, 410, E29.128, E29.129, 257/E29.112
See application file for complete search history.

(56) References Cited

U.S. PATENT DOCUMENTS

| | | | |
|---|---|---|---|
| 6,879,001 B2* | 4/2005 | Yagishita et al. | 257/347 |
| 7,157,378 B2 | 1/2007 | Brask | |
| 7,381,608 B2* | 6/2008 | Brask et al. | 438/216 |
| 7,439,113 B2* | 10/2008 | Doczy et al. | 438/157 |
| 7,888,195 B2* | 2/2011 | Lin et al. | 438/199 |
| 7,915,111 B2* | 3/2011 | Yang et al. | 438/199 |
| 2006/0065939 A1* | 3/2006 | Doczy et al. | 257/412 |
| 2006/0121678 A1* | 6/2006 | Brask et al. | 438/287 |
| 2007/0148838 A1 | 6/2007 | Doris | |
| 2009/0152636 A1* | 6/2009 | Chudzik et al. | 257/369 |
| 2010/0052058 A1* | 3/2010 | Hsu et al. | 257/364 |
| 2011/0018072 A1* | 1/2011 | Lin et al. | 257/410 |

* cited by examiner

*Primary Examiner* — Victor A Mandala
(74) *Attorney, Agent, or Firm* — Winston Hsu; Scott Margo

(57) ABSTRACT

A method for fabricating metal gate transistor is disclosed. First, a substrate having a first transistor region and a second transistor region is provided. Next, a stacked film is formed on the substrate, in which the stacked film includes at least one high-k dielectric layer and a first metal layer. The stacked film is patterned to form a plurality of gates in the first transistor region and the second transistor region, a dielectric layer is formed on the gates, and a portion of the dielectric layer is planarized until reaching the top of each gates. The first metal layer is removed from the gate of the second transistor region, and a second metal layer is formed over the surface of the dielectric layer and each gate for forming a plurality of metal gates in the first transistor region and the second transistor region.

6 Claims, 5 Drawing Sheets

METAL GATE TRANSISTOR AND METHOD FOR FABRICATING THE SAME

BACKGROUND OF THE INVENTION

1. Field of the Invention

The invention relates to a method for fabricating a metal gate transistor.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having high resistance, which causes the polysilicon gate to work under a much lower rate than other metal gates. In order to compensate for slightly lowered rate of performance, a significant amount of suicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2 \times 20^{20}/cm^3$ and $3 \times 10^{20}/cm^3$. As most gate electrodes have a doping concentration of at least $5 \times 10^{21}/cm^3$, the limited doping concentration of polysilicon gates often results in a depletion region at the interface between the gate and the gate dielectric layer. This depletion region not only thickens the gate dielectric layer, but also lowers the capacitance of the gate, and ultimately reduces the driving ability of the device. In order to solve this problem, double work function metal gates are used to replace conventional polysilicon to fabricate gate electrodes for MOS transistors.

However, it is well known in the art that the degree of difficulty for fabricating a well-controlled double work function metal is immense as the process often involves complicated integration between NMOS device and PMOS device. The difficulty increases even more as the thickness and materials used in double work function metal gates requires a much more strict demand. For instance, the conventional technique for fabricating a metal gate transistor often depletes the polysilicon material from the dummy gate before n-type metal and p-type metal are deposited.

As the n-type metal layer often accommodates a major portion of the sidewall of the gate, this approach causes insufficient space for the low resistance conductive material deposited thereafter and creates unbalanced resistance between two adjacent transistor regions and lowers the performance of the transistor. Therefore, how to successfully fabricate double work function metal gate transistors with lower cost and improved performance has become an important task in this field.

SUMMARY OF THE INVENTION

It is an objective of the present invention to provide a method for fabricating a transistor having metal gates.

A method for fabricating metal gate transistor is disclosed. First, a substrate having a first transistor region and a second transistor region is provided. Next, a stacked film is formed on the substrate, in which the stacked film includes at least one high-k dielectric layer and a first metal layer. The stacked film is patterned to form a plurality of gates in the first transistor region and the second transistor region, a dielectric layer is formed on the gates, and a portion of the dielectric layer is planarized until reaching the top of each gates. The first metal layer is removed from the gate of the second transistor region, and a second metal layer is formed over the surface of the dielectric layer and each gate for forming a plurality of metal gates in the first transistor region and the second transistor region.

According to another aspect of the present invention, a metal gate transistor is disclosed. The metal gate transistor preferably includes: a substrate having a first transistor region and a second transistor region and a metal gate disposed on the first transistor region. The first metal gate preferably includes a first high-k dielectric layer disposed on the bottom of the first metal gate, a first metal layer disposed on the first high-k dielectric layer without extending upward for forming the sidewall of the first metal gate, and a second metal layer disposed on the first metal layer and extending upward for forming the sidewall of the first metal gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
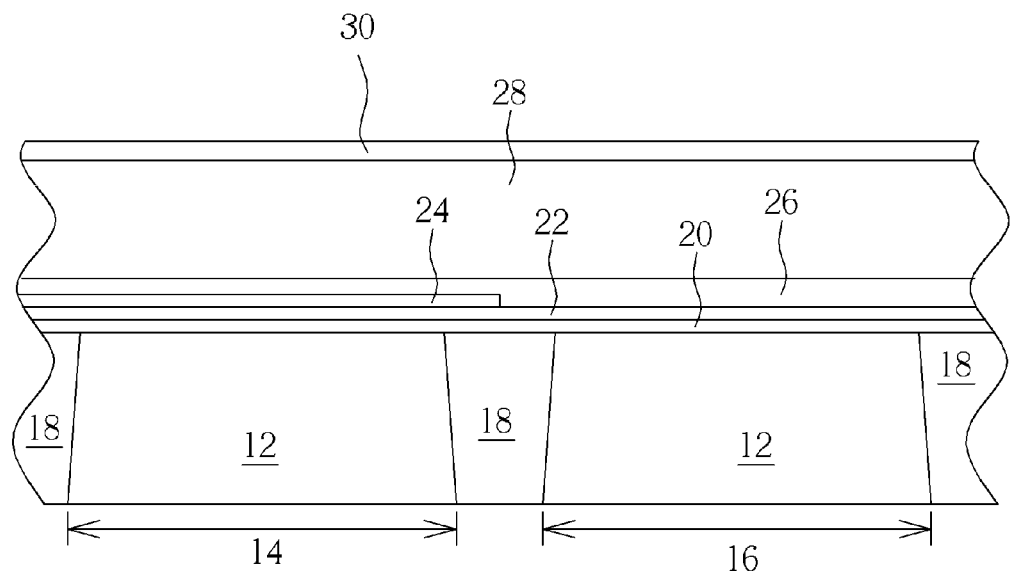
FIGS. 1-9 illustrate a method for fabricating a metal gate transistor according to a preferred embodiment of the present invention.

Referring to FIGS. 1-9, FIGS. 1-9 illustrate a method for fabricating a metal gate transistor according to a preferred embodiment of the present invention. As shown in FIG. 1, a substrate 12, such as a silicon substrate or a silicon-on-insulator substrate is provided. At least a NMOS transistor region 14 and a PMOS transistor region 16 are defined in the substrate 12 and a plurality of shallow trench isolations 18 are also formed for separating the transistor regions 14 and 16.

A gate insulating layer 20 composed of dielectric materials including oxides or nitrides is then deposited over the surface of the substrate 12, and a stacked film composed of a high-k dielectric layer 22, a selective cap layer 24, a n-type metal layer 26, a polysilicon layer 28, and a hard mask 30 is formed on the gate insulating layer 20. Preferably, the cap layer 24 is only disposed in the NMOS transistor region 14 or could be omitted entirely, and the polysilicon layer 28 is used as a sacrificial layer, which may also be composed of polysilicon or other materials.

In this embodiment, the high-k dielectric layer is composed of HfSiO, HfSiON, HfO, LaO, LaAlO, ZrO, ZrSiO, HfZrO, or combination thereof; the cap layer 24 is composed of LaO, $Dy_2O_3$, or combination thereof; the n-type metal layer 26 is composed of TiN, TaC, Ta, TaSiN, Al, TiAlN, or combination thereof; the polysilicon layer 28 is composed of undoped polysilicon material or polysilicon containing n+ dopants; and the hard mask 30 is composed of $SiO_2$, SiN, SiC, SiON, or combination thereof.

Figure 2:
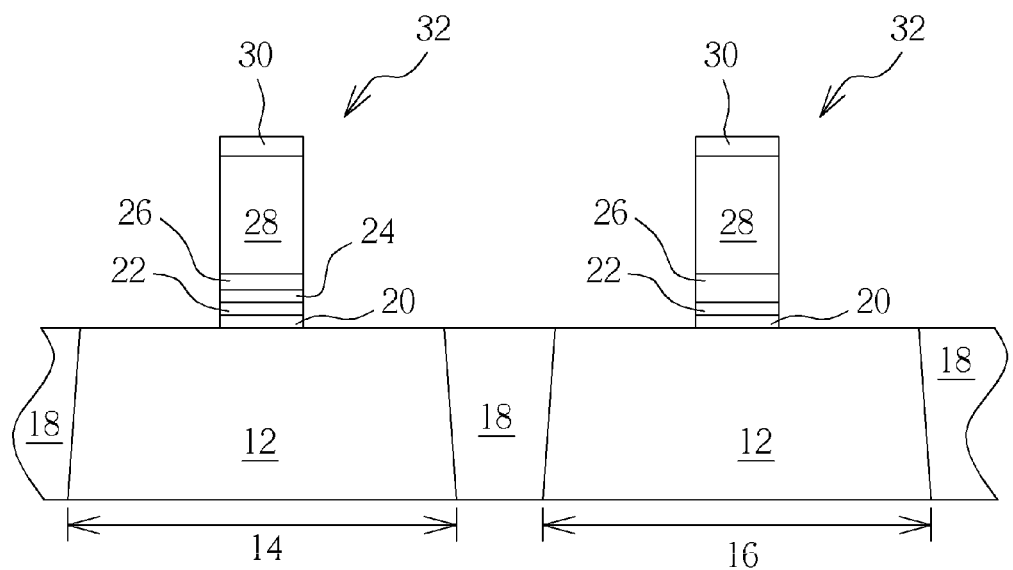

As shown in FIG. 2, a patterned photoresist (not shown) is formed on the hard mask 30, and a pattern transfer process is conducted by using the patterned photoresist as a mask to remove a portion of the hard mask 38, the polysilicon layer 28, the n-type metal layer 26, the cap layer 24, the high-k dielectric layer 22, and the gate insulating layer 20 through single or multiple etching processes. After stripping the patterned photoresist, a plurality of gates 32 is formed on the NMOS transistor region 14 and the PMOS transistor region 16.

Figure 3:
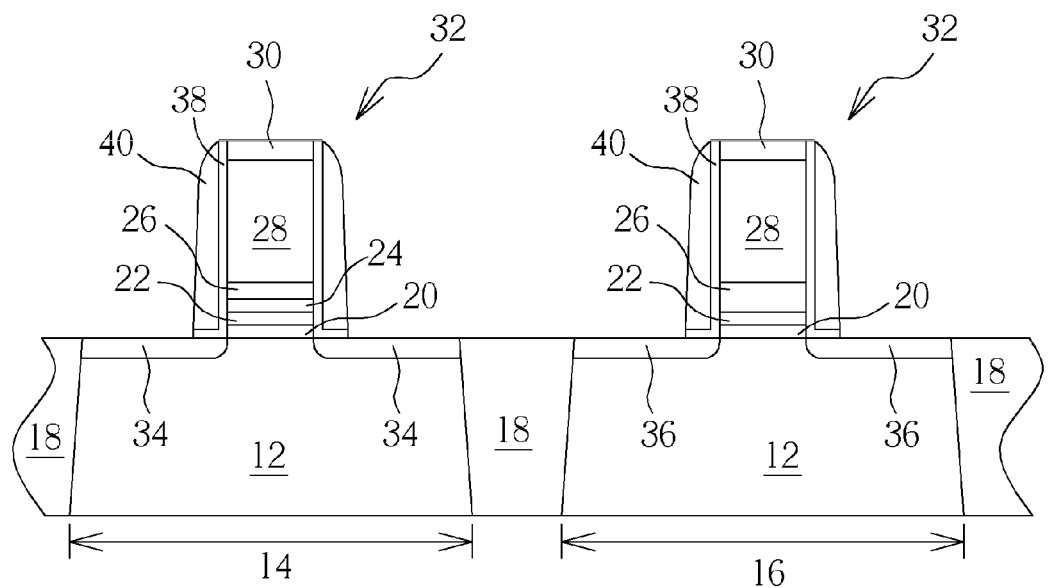

As shown in FIG. 3, a light doping process is performed to form a plurality of lightly doped source/drains in the NMOS transistor region 14 and the PMOS transistor region 16. For instance, a patterned photoresist (not shown) is disposed on regions outside the NMOS transistor region 14, and an ion implantation is conducted by using the patterned photoresist as mask to implant n-type dopants into the substrate 12 adjacent to two sides of the gate 32 of the NMOS transistor region 14 for forming a lightly doped source/drain 34. After stripping the above patterned photoresist, another patterned photoresist is formed on regions outside the PMOS transistor region 16, and another ion implantation is conducted by using the patterned photoresist as mask to implant p-type dopants into the substrate 12 adjacent to two sides of the gate 32 of the PMOS transistor region 16 for forming a lightly doped source/drain 36.

Next, a first stage of the spacer formation is conducted by oxidizing the surface of the polysilicon layer 28 or through deposition process to form a silicon oxide layer 38, depositing a silicon nitride layer 40 and etching the silicon oxide layer 38 and the silicon nitride layer 40 to form a spacer on the sidewall of each gate 32 of the NMOS transistor region 14 and the PMOS transistor region 16.

Figure 4:
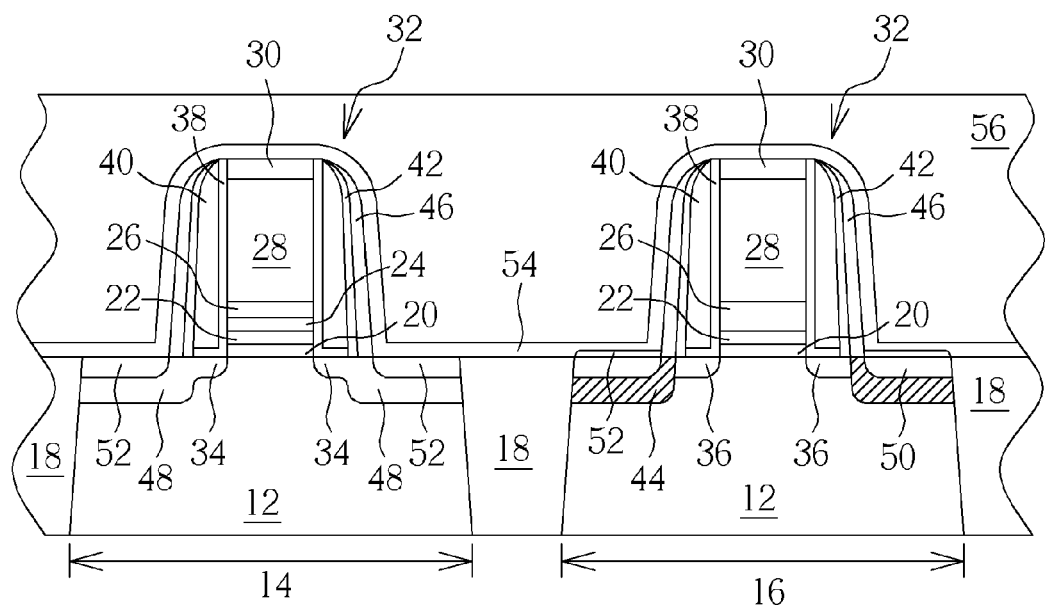

As shown in FIG. 4, a passivation layer 42 composed of silicon nitride is formed over the surface of the silicon nitride layer 40, and a selective epitaxial growth process is conducted to form strained silicon in the substrate 12 of the NMOS transistor region 14 and the PMOS transistor region 16. For instance, two recesses could be formed in the substrate 12 at two sides of the gate 32 of the PMOS transistor region 16, and an epitaxial layer 44 composed of silicon germanium is epitaxially grown to substantially fill the two recesses. The epitaxial layer 44 preferably provides a compressive strain to the channel region of the PMOS transistor region 16 thereby increasing the hole mobility of the PMOS transistor. Depending on the demand of the fabrication, an epitaxial layer composed of SiC could also be grown in the substrate 12 at two sides of the gate 32 of the NMOS transistor region 14 to provide a tensile strain to the channel region of the NMOS transistor region 14 and increase the electron mobility of the NMOS transistor.

Next, second stage of the spacer formation is performed to form a spacer 46 composed of silicon oxide on the sidewall of the passivation layer 42 of the NMOS transistor region 14 and the PMOS transistor region 16.

A heavy doping process is conducted to form a plurality of source/drain regions in the two transistor regions 14, 16. Similar to the aforementioned light doping process, a patterned photoresist (not shown) can be disposed on regions outside the NMOS transistor region 14, and an ion implantation is conducted by using this patterned photoresist as mask to implant n-type dopants into the substrate 12 at two sides of the spacer 46 of the NMOS transistor region 14 to form a source/drain region 48. After stripping the photoresist, another patterned photoresist is disposed on regions outside the PMOS transistor region 16 and another ion implantation is performed by using the newly deposited patterned photoresist as mask to implant p-type dopants into the substrate 12 at two sides of the spacer 46 of the PMOS transistor region 16 to form another source/drain region 50.

It should be noted that the aforementioned source/drain regions could be fabricated by using selective epitaxial process, the order of the fabrication process could be rearranged or adjusted according to the demand of the product, and the number of the spacers could also adjusted accordingly. For instance, either one of the silicon oxide layer 38 and the silicon nitride layer 40 formed during the first stage of the main spacer formation could be omitted, and either one of the passivation layer 42 and the spacer 46 could also be omitted. Moreover, the main spacer composed of silicon oxide layer 38 and the silicon nitride layer 40 could be fabricated before or after the formation of the lightly doped source/drains 34, 36; the main spacer composed of silicon oxide layer 38 and the silicon nitride layer 40 and the source/drain region could be formed before removing the spacer and forming the lightly doped source/drain; the spacers could be formed before an epitaxial layer is formed in the recess of the semiconductor substrate, and the outer most spacer is removed before forming the source/drain region; a recess could be formed in the semiconductor substrate to deposit an epitaxial layer after forming the lightly doped source/drain, and the spacer and source/drain region are formed thereafter. The aforementioned order for fabricating lightly doped source/drains, spacers, and source/drain regions are all within the scope of the present invention.

After the source/drain regions 48, 50 are formed, a salicide process is performed by first depositing a metal layer (not shown) composed of cobalt, titanium, nickel, platinum, palladium, or molybdenum over the surface of the substrate 12 and the spacer 46, and a rapid thermal annealing process is conducted to form a silicide 52 at two sides of the spacer 46. Un-reacted metal layer remained from the salicide process is removed thereafter.

Next, a silicon nitride layer 54 is deposited over the surface of each gate 32, spacer 46, and substrate 12. In this embodiment, the silicon nitride layer 54, preferably serving as an etch stop layer in a planarizing process conducted afterwards, is formed with a depth of approximately 100 angstroms. Additionally, at least one stress layer (not shown) composed of thicker silicon nitride could also be deposited on the NMOS transistor region 14 and the PMOS transistor region 16 respectively. Preferably, a stress layer providing tensile strain is disposed in the NMOS transistor region 14 whereas a stress layer providing compressive strain is disposed in the PMOS transistor region 16. The stress layer is formed not only to provide stress for the MOS transistor but also serving as an etching stop layer. An interlayer dielectric layer 56 composed of oxides is deposited on the silicon nitride layer 54 of both NMOS transistor region 14 and PMOS transistor region 16. The interlayer dielectric layer 56 could also include nitrides, carbides, low dielectric constant material or combination thereof.

Figure 5:
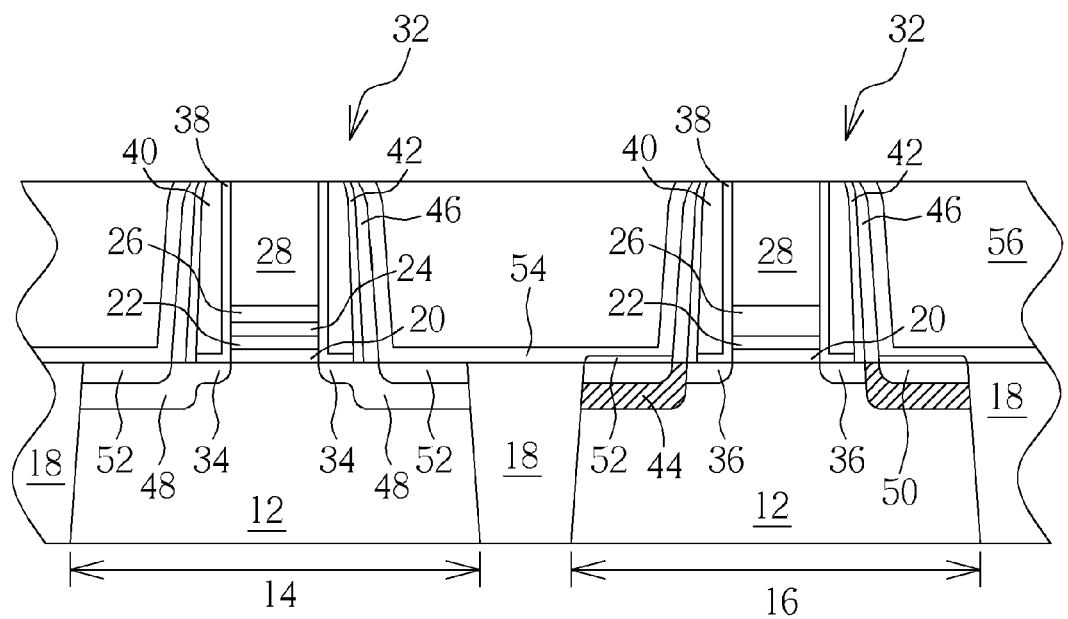

As shown in FIG. 5, a chemical mechanical polishing process or a dry etching process is performed to remove a portion of the interlayer dielectric layer 56, the silicon nitride layer 54, and the hard mask 30 until reaching and exposing the surface of the gate 32, such that the top of the gate 32 is substantially even with the surface of the interlayer dielectric layer 56.

Figure 6:
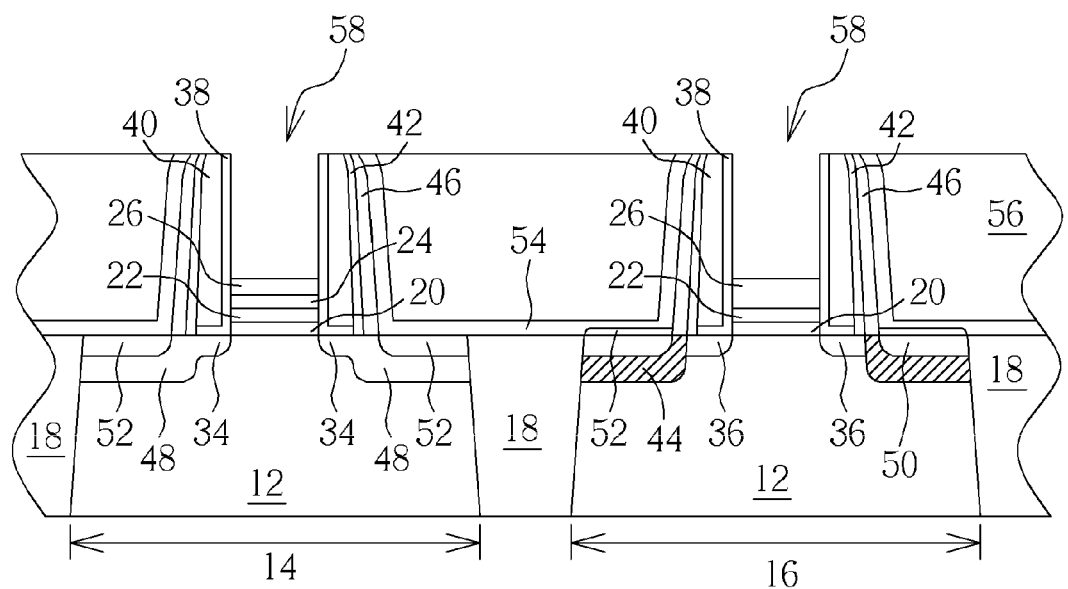

As shown in FIG. 6, a selective dry etching or wet etching is conducted by using ammonium hydroxide ($NH_4OH$) or tetramethylammonium hydroxide (TMAH) to remove the polysilicon layer 28 disposed in the NMOS transistor region 14 and the PMOS transistor region 16 without damaging the interlayer dielectric layer 56. In this embodiment, the etching process preferably forms an opening 58 in each transistor region 14, 16 to expose the n-type metal layer 26 underneath.

Figure 7:
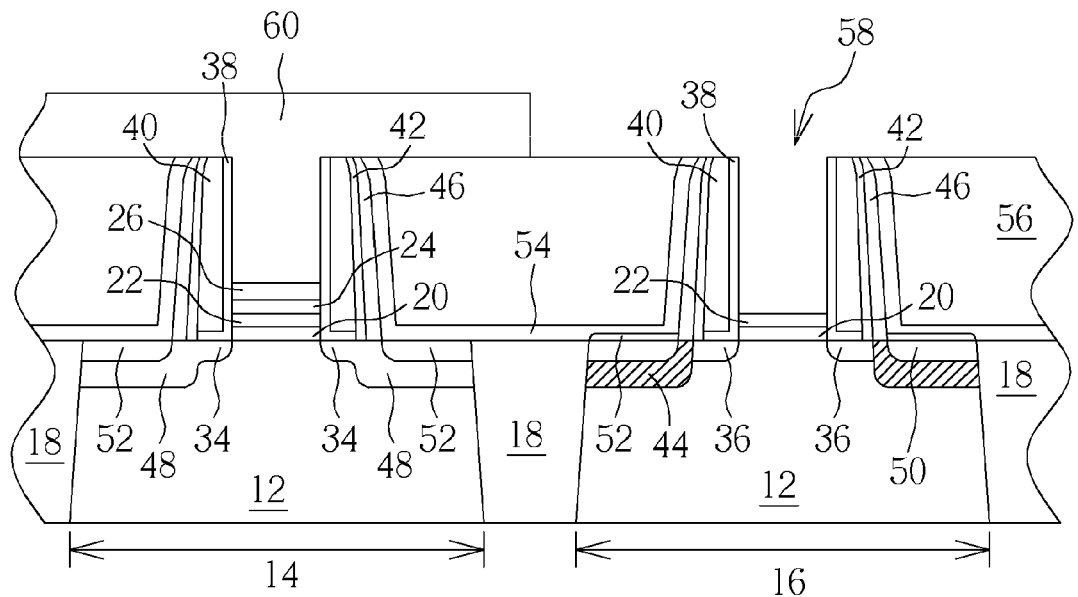

As shown in FIG. 7, a patterned photoresist 60 is formed on the NMOS transistor region 14, and a dry etching or wet etching is conducted to remove the n-type metal layer 26 disposed in the PMOS transistor region 16. Preferably, solutions selected from $NH_4OH$, $H_2O_2$, $H_2SO_4$, or mixture of HCl and deionized water could be used as etchant for conducting a wet etching process, and gases selected from a group consisting of $BCl_3$, $Cl_2$, $SF_6$, nitrogen gas, and argon gas could be used to facilitate a dry etching process. In either method, etchants are used to only remove the n-type metal layer 26 disposed in the PMOS transistor region and expose the high-k dielectric layer 22 underneath without damaging the high-k dielectric layer 22.

Figure 8:
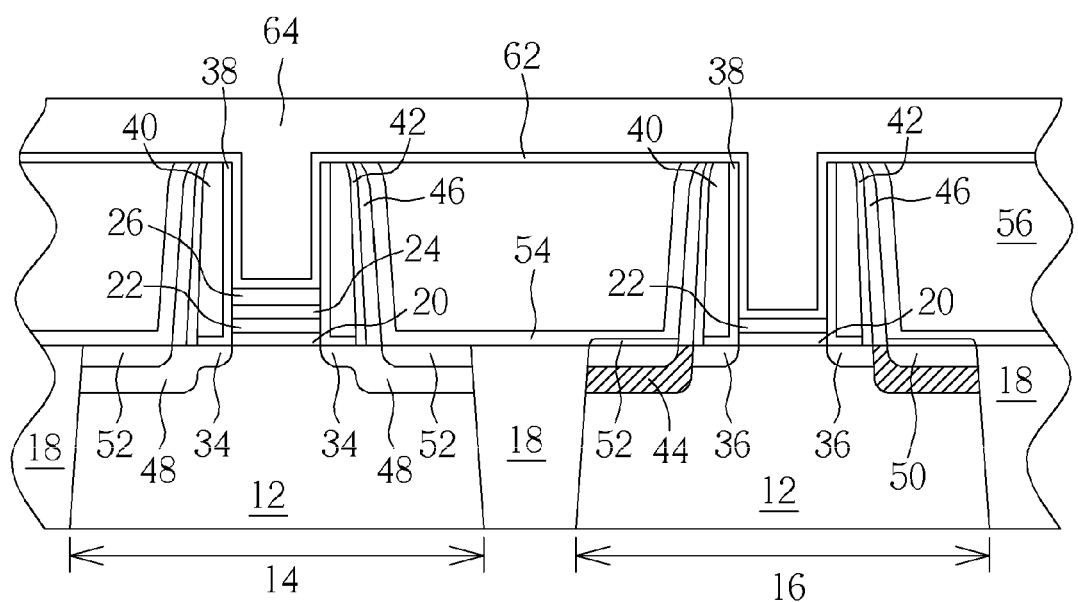

After stripping the patterned photoresist 60, as shown in FIG. 8, a p-type metal layer 62 is deposited on the interlayer dielectric layer 56 to cover the n-type metal layer 26 disposed in the NMOS transistor region 14, the sidewall of the opening 58 of the NMOS transistor region 14, the high-k dielectric layer 22 disposed in the PMOS transistor region 16, and the sidewall of the opening 58 of the PMOS transistor region 16. Preferably, the p-type metal layer 62 is composed of TiN, W, WN, Pt, Ni, Ru, TaCN, or TaCNO.

A conductive layer 64 composed of low resistance material is deposited on the metal layer 62 of the NMOS transistor region 14 and the PMOS transistor region 16 to fill the openings 58. The conductive layer 64 is preferably composed of Al, W, TiAl or CoWP.

Figure 9:
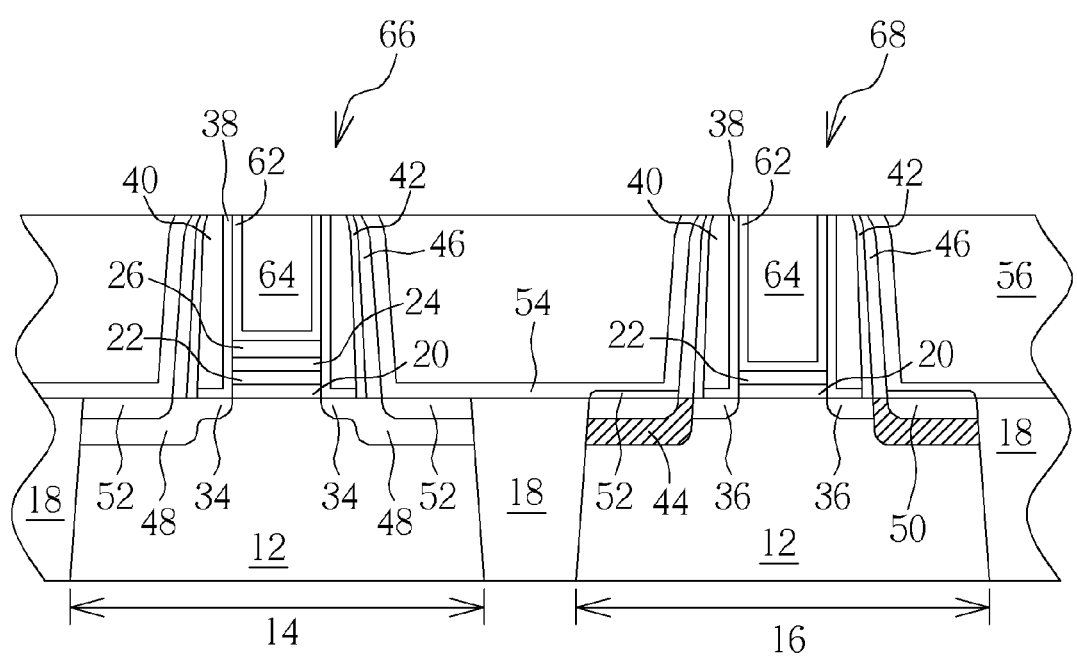

As shown in FIG. 9, another chemical mechanical polishing process is performed to remove a portion of the conductive layer 64 and the metal layer 62 for forming a CMOS transistor with metal gates 66 and 68.

Referring again to FIG. 9, which illustrates a schematic view of a CMOS transistor with metal gates 66 and 68 fabricated by the aforementioned process. The CMOS transistor includes a substrate 12, two metal gates 66, 68 disposed on the substrate 12 of the NMOS transistor region 14 and the PMOS transistor region 16, and two source/drain regions 48, 50 formed in the substrate 12 with respect to two sides of the metal gates 66, 68. The metal gate 66 of the NMOS transistor region 14 includes a gate insulating layer 20 disposed on the bottom of the metal gate 66, a high-k dielectric layer 22 disposed on the gate insulating layer 20, a cap layer 24 disposed on the high-k dielectric layer 22, a n-type metal layer 26 disposed on the surface of the cap layer 24 without extending upward to form the sidewall of the metal gate 66, a U-shaped p-type metal layer 62 disposed on the n-type metal layer 26 while extending upward to form the sidewall of the metal gate 66, and a conductive layer 64 disposed on the p-type metal layer 62 to fill the remaining opening 58 of the NMOS transistor region 14. In this embodiment, the high-k dielectric layer, 22, the cap layer 24, and the n-type metal layer 26 are disposed in the substantially bottom portion of the metal gate 66 while not extending upward to form the sidewall of the metal gate 66.

The metal gate 68 of the PMOS transistor region 16 includes a gate insulating layer 20 disposed on the bottom of the metal gate 66, a high-k dielectric layer 22 disposed on the gate insulating layer 20, a U-shaped p-type metal layer 62 disposed on the high-k dielectric layer while extending upward to form the sidewall of the metal gate 68, and a conductive layer 64 disposed on the p-type metal layer 62 to fill the opening 58 of PMOS transistor region 16.

Overall, the present invention first deposits a stacked film composed of high-k dielectric layer, n-type metal layer, and polysilicon material on a substrate, patterns this stacked film to form a gate, forms a planarizing interlayer dielectric layer, removes the polysilicon material from the gate, and deposits p-type metal and low resistance material sequentially. As the n-type metal layer is disposed on the bottom of the metal gate before the polysilicon material is removed, a much greater space is provided for the deposition of low resistance conductive layer as the sidewall of the gate is no longer accommodated by the n-type metal layer. This creates a much more balanced resistance between two adjacent NMOS and PMOS transistor regions and also increases the overall performance of the CMOS transistor.

Those skilled in the art will readily observe that numerous modifications and alterations of the device and method may be made while retaining the teachings of the invention.

What is claimed is:

1. A metal gate transistor, comprising:
   a substrate having a first transistor region and a second transistor region;
   a first metal gate disposed on the first transistor region, wherein the first metal gate further comprises:
   a first high-k dielectric layer disposed on the bottom of the first metal gate;
   a first metal layer disposed on the first high-k dielectric layer without extending upward for forming the sidewall of the first metal gate; and
   a second metal layer disposed on the first metal layer and extending upward for forming the sidewall of the first metal gate, wherein the second metal layer is U-shaped.

2. The metal gate transistor of claim 1, further comprising:
   a second metal gate disposed on the second transistor region, comprising:
   the first high-k dielectric layer disposed on the bottom of the second metal gate; and
   the second metal layer disposed on the first high-k dielectric layer while extending upward for forming the sidewall of the second metal gate.

3. The metal gate transistor of claim 1, further comprising a cap layer disposed between the first high-k dielectric layer and the first metal layer.

4. The metal gate transistor of claim 3, wherein the cap layer comprises LaO or $Dy_2O_3$.

5. The metal gate transistor of claim 1, further comprising a third metal layer disposed on the first metal layer and the second metal layer.

6. The metal gate transistor of claim 5, wherein the third metal layer comprises Al, W, TiAl, or CoWP.

* * * * *